United States Patent
Kallam et al.

(10) Patent No.: US 11,106,268 B2
(45) Date of Patent: Aug. 31, 2021

(54) METHOD AND SYSTEM FOR SAVING POWER IN A REAL TIME HARDWARE PROCESSING UNIT

(71) Applicant: Redpine Signals, Inc., San Jose, CA (US)

(72) Inventors: Subba Reddy Kallam, Sunnyvale, CA (US); Venkat Mattela, San Jose, CA (US); Aravinth Kumar Ayyappannair Radhadevi, Kanyakumari (IN); Sesha Sairam Regulagadda, Narasapuram (IN)

(73) Assignee: Redpine Signals, Inc., San Jose, CA (US)

( * ) Notice: Subject to any disclaimer, the term of this patent is extended or adjusted under 35 U.S.C. 154(b) by 0 days.

(21) Appl. No.: 16/445,238

(22) Filed: Jun. 19, 2019

(65) Prior Publication Data

US 2020/0401206 A1    Dec. 24, 2020

Related U.S. Application Data (60) Provisional application No. 62/711,555, filed on Jul. 29, 2018.

(51) Int. Cl.
| | |
|---|---|
| *G06F 1/32* | (2019.01) |
| *G06F 15/80* | (2006.01) |
| *G06F 1/3234* | (2019.01) |
| *H03M 1/80* | (2006.01) |
| *G06F 1/06* | (2006.01) |

(Continued)

(52) U.S. Cl.
CPC .............. *G06F 1/3243* (2013.01); *G06F 1/06* (2013.01); *G06F 7/5443* (2013.01); *G06F 15/8092* (2013.01); *H03M 1/1205* (2013.01); *H03M 1/662* (2013.01); *H03M 1/802* (2013.01)

(58) Field of Classification Search
CPC ........... G06F 1/32; G06F 15/8092; G06F 1/06
See application file for complete search history.

(56) References Cited

U.S. PATENT DOCUMENTS

| | | | | |
|---|---|---|---|---|
| 4,803,462 A | * | 2/1989 | Hester ................. | H03M 1/0682 341/172 |
| 6,404,414 B2 | * | 6/2002 | Ishii ..................... | G09G 3/3648 345/100 |

(Continued)

*Primary Examiner* — Phil K Nguyen
(74) *Attorney, Agent, or Firm* — File-EE-Patents.com; Jay A. Chesavage (57) ABSTRACT

The present invention provides an analog-digital hybrid architecture, which performs 256 multiplications and additions at a time. The system comprises 256 Processing Elements (PE) (108), which are arranged in a matrix form (16 rows and 16 columns). The digital inputs (110) are converted to analog signal (114) using digital to analog converters (DAC) (102). One PE (108) produces one analog output (115) which is nothing but the multiplication of the analog input (114) and the digital weight input (112). The implementation of PE is done by using i) capacitors and switches and ii) resistor and switches. The outputs from multiple PEs (108) in a column are connected together to produce one analog MAC output (116). In the similar manner, the system produces 16 MAC outputs (118) corresponding to 16 columns. Analog to digital converters (ADC) (104) are used to convert the analog MAC output (116) to digital form (118).

5 Claims, 8 Drawing Sheets

(51) Int. Cl.
*H03M 1/12* (2006.01)
*G06F 7/544* (2006.01)
*H03M 1/66* (2006.01)

(56) References Cited

U.S. PATENT DOCUMENTS

| | | | | |
|---|---|---|---|---|
| 2008/0062286 | A1* | 3/2008 | Beck | H04N 5/357 348/241 |
| 2008/0079621 | A1* | 4/2008 | Horibata | H03M 1/804 341/153 |
| 2010/0007539 | A1* | 1/2010 | Hu | H03M 1/68 341/150 |
| 2010/0194948 | A1* | 8/2010 | Murakami | H04N 5/3658 348/302 |
| 2010/0321105 | A1* | 12/2010 | Romero | H03H 19/004 327/554 |
| 2011/0227611 | A1* | 9/2011 | Yeh | H03K 3/0307 327/102 |
| 2012/0127122 | A1* | 5/2012 | Lim | G06F 3/0446 345/174 |
| 2013/0308396 | A1* | 11/2013 | Cho | G11C 5/14 365/189.09 |

\* cited by examiner

*Figure 1C*
One PE Cell

METHOD AND SYSTEM FOR SAVING POWER IN A REAL TIME HARDWARE PROCESSING UNIT

FIELD OF THE INVENTION

The present invention relates generally to the field of electronic hardware processing systems. In particular, the invention relates to a method and system for saving power in a real time hardware processing unit.

BACKGROUND OF THE INVENTION

In the existing technology, there are hardware accelerators for different applications such as Convolution Neural Network (CNN). The basic operation of a CNN involves dot product or Multiplication and Accumulation (MAC). In the digital domain, Multiplication and Accumulation (MAC) operation is performed by using a set of digital circuits, which operate in a sequence to realize multiplication and addition. These digital circuits are very power hungry and are not an optimum solution for low power real time applications.

The multiplication and accumulation (MAC) operations can be efficiently implemented in Analog domain with very low power consumption. The MAC operation in analog circuit domain can be realized in multiple methods. The two different methods for realizing multiplication and addition operation in Analog domain are i) using capacitor circuit ii) using resistor circuit.

In a conventional circuit using capacitors, the multiplication operation is realized by charging the analog input into one capacitor value which is proportional to the digital input and, sharing the charge into another fixed value capacitor. However, for performing several independent multiplications in a sequence (one after other), the capacitors are needed to be reset to zero in between successive multiplication operations. This reset operation requires an extra clock cycle. By taking extra clock cycle to reset the capacitors, the circuit operation becomes slow or it needs higher power to operate the circuit at higher speed. At the same time by resetting all the capacitors to zero, the charge which was stored in the capacitors is completely wasted in between each successive operation. This necessitates the input source to supply more energy to freshly charge the capacitors in each computing cycle, which requires additional power, and more charging time which also slows down the operation of the circuit.

To implement a conventional 8 bit multiplier unit with resistors, it requires $2^8$ (=256) resistors and 256 switches to generate 256 distinct voltage samples from the input voltage and occupies larger area similar to the single resistive string digital to analog converters (DACs). To overcome this problem, researchers used two or more resistive strings, which reduces overall area. Various techniques are reported in the design of higher resolution DACs with two or more resistive strings as disclosed in U.S. Pat. No. 3,997,892, US2018/0183451A1, U.S. Pat. No. 5,703,588.

As disclosed in U.S. Pat. No. 3,997,892, and US2018/0183451A1, the two resistive strings are connected through buffers to avoid the loading effect of sub resistive string on the main resistive string. The buffers dissipate additional power and occupy extra die area.

Instead of isolating the main resistive string with the sub resistive string with buffer, the use of a current Source is suggested in U.S. Pat. No. 5,703,588 by utilizing a constant current to drive the Sub-resistive String. The design and application of an additional current sources for the sub resistive string increases the complexity of the overall system. However, connecting sub resistive string on main resistive string with switches introduces variation in the output voltage due to the resistance of the switches.

In order to overcome the problems of the existing technology as stated herein above paragraphs, the present inventors have developed a hybrid architecture comprises individual processing elements (PEs), ADCs and DACs, which are connected in a unique manner wherein the individual processing elements are realized by unique methods using i) capacitors and ii) resistors whereby producing multiple MAC outputs in a clock duration with very low power consumption.

OBJECTS OF THE INVENTION

A first object of the invention is to provide a method for saving power in a real time hardware processing unit.

A second object of the invention is to provide a system for saving power in a real time hardware processing unit.

SUMMARY OF THE INVENTION

The present invention provides a hybrid hardware accelerator for different applications such as Convolution Neural Network (CNN). The basic operation of a CNN involves a dot product, or Multiplication and Accumulation (MAC). According to one embodiment of the present invention, the MAC operation is performed by using analog-digital hybrid architecture, which performs 256 multiplications and additions at a time. The system comprises 256 Processing Elements (PE) (108), which are arranged in a matrix form (16 rows and 16 columns). In the system, the digital inputs (110) are converted to analog signal (114) using digital to analog converters (DAC) (102). In the present invention, 16 DACs are used to generate analog inputs for PE elements. Each DAC broadcasts its analog output to all the PE cells in a row as their analog inputs. One PE (108) produces one analog output (115) which is nothing but the multiplication of its analog input (114) and digital weight input (112). The implementation of PE is done by using i) capacitors and switches and ii) resistor and switches. The outputs from multiple PEs (108) in a column are connected together to produce one analog MAC output i.e. an analog dot product output (116). In the similar manner, the system produces 16 analog MAC outputs (118) corresponding to 16 columns. Analog to digital converters (ADC) (104) are used to convert the analog MAC output (116) to digital form (118). There are 16 ADCs are used wherein one for each column. In the present invention, the 256 PE cells which are arranged in 16×16 matrix form, 16 DACs and 16 ADCs are used for explanation purpose only. However, the present invention is also applicable for implementing a system using "m×n" PE cells arranged in a matrix of "m" rows and "n" columns wherein "m" number of DACs and "n" number of ADCs are used.

According to another aspect of the present invention, there is provided a method for saving power in a real time hardware processing unit. The method comprising: connecting a plurality of processing elements (PEs) (108) in a matrix form; wherein a first set of the processing elements (PEs) (108) comprises a multiple sets of the processing elements (PEs) (108); wherein each set of the multiple sets of the processing elements (PEs) (108) of the first set comprises a plurality of the processing elements (PEs) (108) being adapted to connect in a row; wherein a second set of the processing elements (PEs) (108) comprises a multiple sets of the processing elements (PEs) (108); wherein each set of the multiple sets of the processing elements (PEs) (108) of the second set comprises a plurality of the processing elements (PEs) (108) being adapted to connect in a column; connecting a plurality of digital to analog converters (DAC) (102) to each the set of the multiple sets of the processing elements (PEs) (108) of the first set; wherein converting a plurality of digital inputs (110) to a first analog output (114) using each the digital to analog converter (DAC) (102); sending the first analog output (114) to the plurality of the processing elements (PEs) (108) being adapted to connect in the row using each the digital to analog converters (DAC) (102) such that the first analog output of the digital to analog converters (DAC) (102) being an input to the plurality of the processing elements (PEs) (108) being adapted to connect in the row; generating a second analog output (115) corresponding to each the processing element (PE) (108); wherein the second analog output of each the processing element (PE) (108) is a product of the first analog output of the digital to analog converter (DAC) and a digital weight input (112); generating an analog dot product_output (116) using each the set of the multiple sets of the processing elements (PEs) (108) of the second set; connecting each the set of the multiple sets of the processing elements (PEs) (108) of the second set using an analog to digital converter (ADC); wherein converting the analog dot product output (116) to a digital output (118) using each the analog to digital converter (ADC) (104).

According to another embodiment of the present invention, the circuit implementation of one multiplication operation between an analog input and a digital input is done by using capacitors (210) and switches (212). Each capacitor (210) is connected to the analog input (202a/202b) through two switches (212), wherein each switch is controlled by the "ph1" clock (214a) and the corresponding digital input bit (204) respectively. In addition to that, each capacitor is short circuited through two switches, wherein each switch is controlled by the "ph1" clock (214a) and the complement of the corresponding digital input (208) bit. Hence, with the same clock ("ph1") (214a), the analog input (202a/202b) will be sampled into the capacitors corresponding to the digital input (204) bits which are "1", and rest of the capacitors will be reset. In the present invention, the capacitors (210) are reset to zero in between successive multiplication operations without extra clock cycle.

According to another embodiment of the present invention, a sub resistive string having 16 equal value of series resistors (R16 to R31) is directly connected at the node of the first resistor (R0) of the main resistor string (R0 to R15). The resistance of the first resistor (R0) of the main resistive string is increased to maintain the effective branch resistance equal to the all other branch resistances (R1 to R15) of the main string. In this way, the main resistive string is dividing the input voltage into 16 distinct values with each step being vin/16 and the sub resistive string dividing the node voltage which is equal to Vin/16 into 16 sub divisions with each step being vin/256. In the present invention, the two resistive strings are connected without having switches or buffers and produce 16 main and 16 sub monotonic voltages. The main resistive string voltage sampled on the top plate (314a/316a) of the capacitor (314/316) through switches with respect to the 4 MSB bits and corresponding decoders during 'ON' period of the clock; Similarly, the bottom plate (314b/316b) connects to the sub resistive string node through switches with respect to 4 LSB bits and corresponding decoders during 'ON' period of the clock. For each input, the present invention produces the output voltage (310) which is proportional to the product of input voltage (302) and the coefficient of digital input (B) (304).

BRIEF DESCRIPTION OF THE DRAWINGS

Features, aspects, and advantages of the present invention will be better understood when the following detailed description is read with reference to the accompanying drawings in which like characters represent like parts throughout the drawings, wherein.

It should be understood that the drawings are an aid to understand certain aspects of the present invention and are not to be construed as limiting.

DETAILED DESCRIPTION OF THE INVENTION

While system and method are described herein by way of example and embodiments, those skilled in the art recognize that a method and system for saving power in a real time hardware processing unit are not limited to the embodiments or drawings described. It should be understood that the drawings and description are not intended to be limiting to the particular form disclosed. Rather, the intention is to cover all modifications, equivalents and alternatives falling within the spirit and scope of the appended claims. Any headings used herein are for organizational purposes only and are not meant to limit the scope of the description or the claims. As used herein, the word "may" is used in a permissive sense (i.e., meaning having the potential to) rather than the mandatory sense (i.e., meaning must). Similarly, the words "include", "including", and "includes" mean including, but not limited to.

The following description is full and informative description of the best method and system presently contemplated for carrying out the present invention which is known to the inventors at the time of filing the patent application. Of course, many modifications and adaptations will be apparent to those skilled in the relevant arts in view of the following description in view of the accompanying drawings and the appended claims. While the system and method described herein are provided with a certain degree of specificity, the present technique may be implemented with either greater or lesser specificity, depending on the needs of the user. Further, some of the features of the present technique may be used to advantage without the corresponding use of other features described in the following paragraphs. As such, the present description should be considered as merely illustrative of the principles of the present technique and not in limitation thereof, since the present technique is defined solely by the claims.

It is worth noting that the present discussion relates to exemplary embodiments, and the appended claims should not be limited to the embodiments discussed herein. Disclosed embodiments provide a method and system of saving power in a real time hardware processing circuit.

Figure 1A:
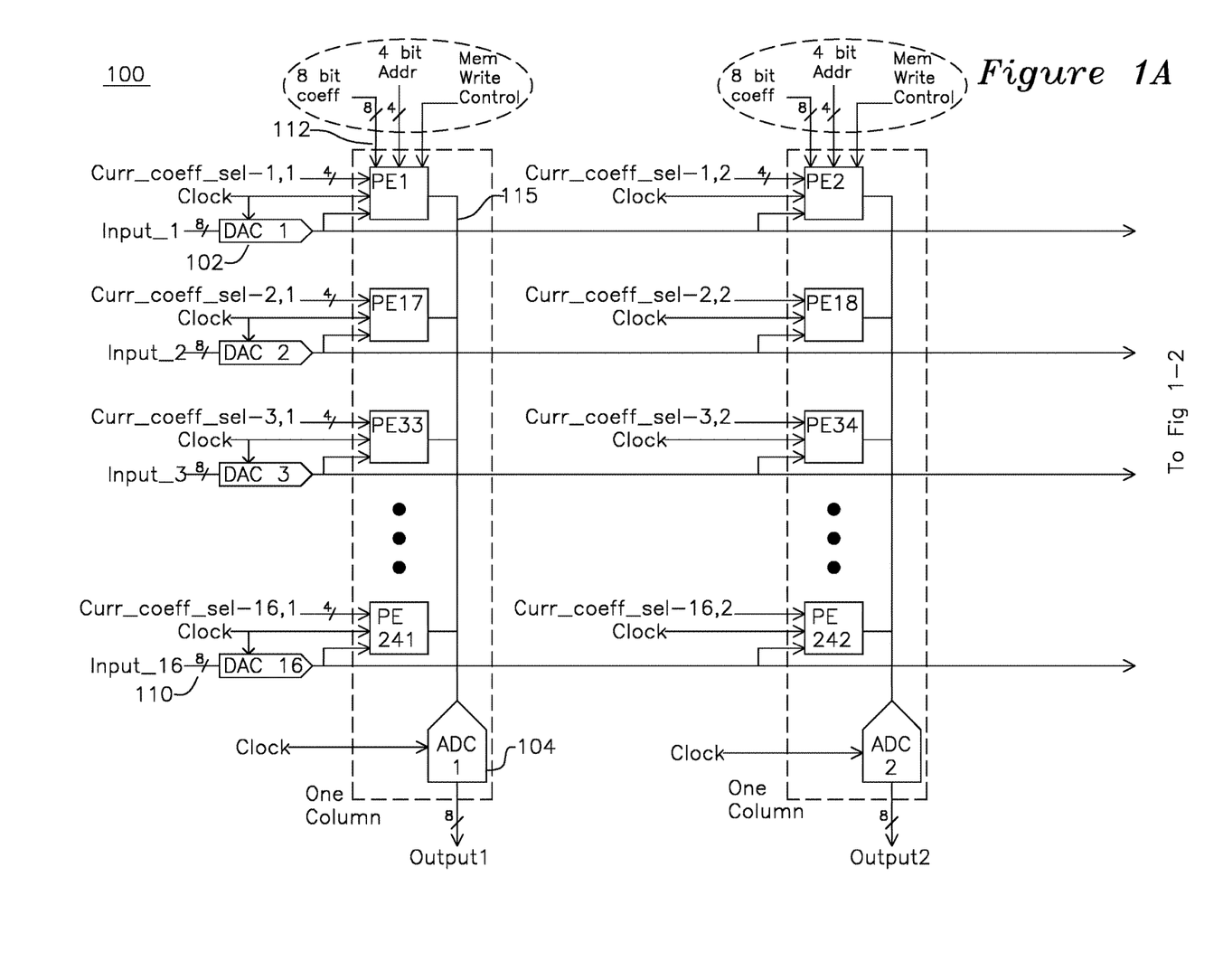
FIGS. 1A and 1B illustrate block diagram of 16×16 MAC array, in accordance with an embodiment of the present invention.
Figure 1B:
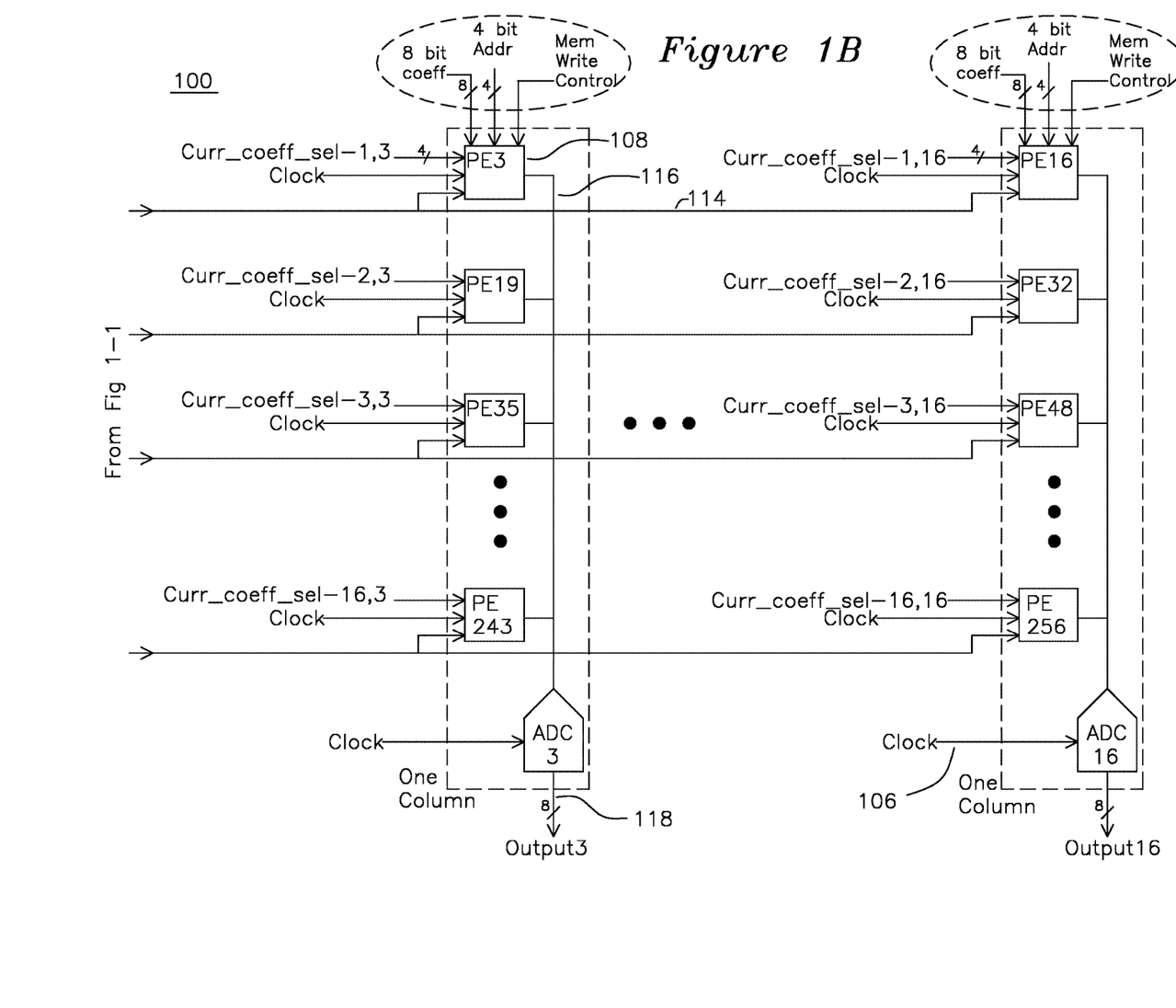

FIGS. 1A and 1B show a block diagram of a 16×16 MAC array, in accordance with an embodiment of the present invention. The present invention provides a hardware accelerator for Convolution Neural Network (CNN). The basic operation of a CNN involves dot product or Multiplication and Accumulation (MAC). In this invention, the MAC operation is performed by using analog-digital hybrid architecture, as shown in FIGS. 1A and 1B, which performs 256 multiplications and additions at a time (within one clock period).

The system comprises 256 (PE1-PE256) Processing Elements (PE) (108), which are arranged in a matrix form (16 rows and 16 columns). The digital input (110) is common for each PE in a row and hence requiring 16 digital inputs (110). However, the digital weights (112) are unique to each PE cell (108).

The inputs, which are provided to the system, are clock (106), 16 digital inputs of 8-bit width (110) and 8-bit digital weights (minimum of 256 weights from a memory) (112). Each of the 16 digital input is common to all PE cells in a row. The 8-bit width for digital input is taken or mentioned here for explanation purpose only. However, the present invention is also applicable to n-bit width. By taking the inputs, the system produces 16 MAC outputs in digital form (8-bit) (118) as shown in FIGS. 1A and 1B. The operational part of the system for producing the output by taking the inputs is as follows:

At first, the digital inputs (110) are converted to analog signal (114) using digital to analog converters (DAC) (102). Each row uses one DAC (DAC1-DAC16) (102) and converts the digital input to the analog output and then the analog output (116) obtained from the DAC (102) is connected to all PE cells (108) in the row.

Figure 1C:
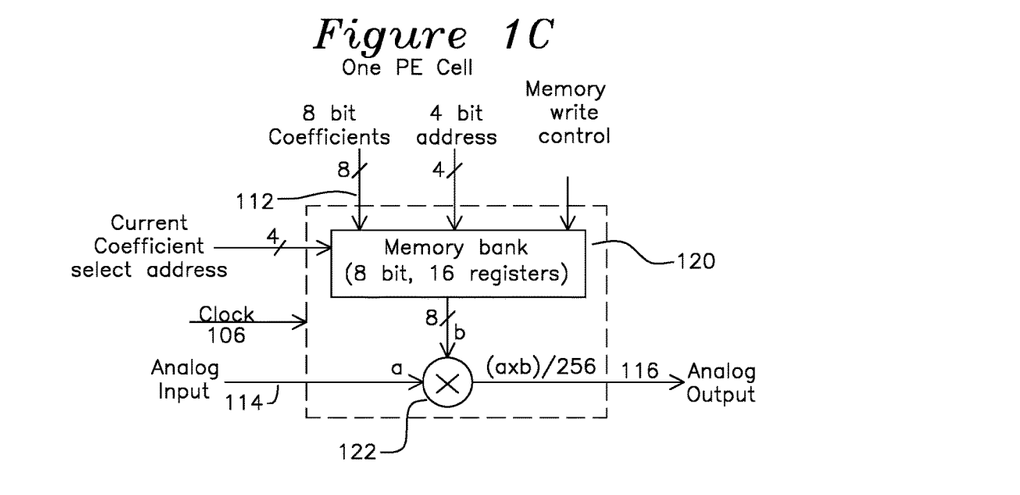
FIG. 1C illustrates a schematic diagram of a Processing Element (PE) unit, in accordance with an embodiment of the present invention.

The processing element (PE) (108) is the primary component in the accelerator system. As shown in the FIG. 1C, each PE (108) comprises a multiplier (122) and a small amount of storage memory (120). The digital weights (8-bit digital number) (112) are stored in the storage memory (120) and are used for several times. The multiplier (122) takes an analog input (114) and a digital weight (digital input) (112) and multiplies both. In other words, one processing element (108) produces one analog output (116) which is nothing but the multiplication of the analog input (114) and the digital weight input (112). The outputs from multiple PEs (108) are connected together, which is equivalent to accumulation, to produce one analog MAC output (116).

The system or architecture produces 16 (8-bit) MAC outputs (118) in single clock (106) cycle and each MAC output (118) is computed by performing 16 multiplications and adding all the 16 multiplication outputs. In other words, the accumulation operation is performed by combining the outputs of all the 16 PEs in a column. In the similar manner, the system produces 16 MAC outputs (118) corresponding to 16 columns.

Accumulation operation is performed in column basis, thus producing 16 analog outputs (116). Analog to digital converters (ADC) (104) are used to convert the analog MAC output (116) back to digital form (118). There are 16 ADCs (ADC1-ADC16) present in the system, which are used for converting the analog outputs (116) to digital form (118), wherein one ADC (104) is used for one column respectively.

Figure 1D:
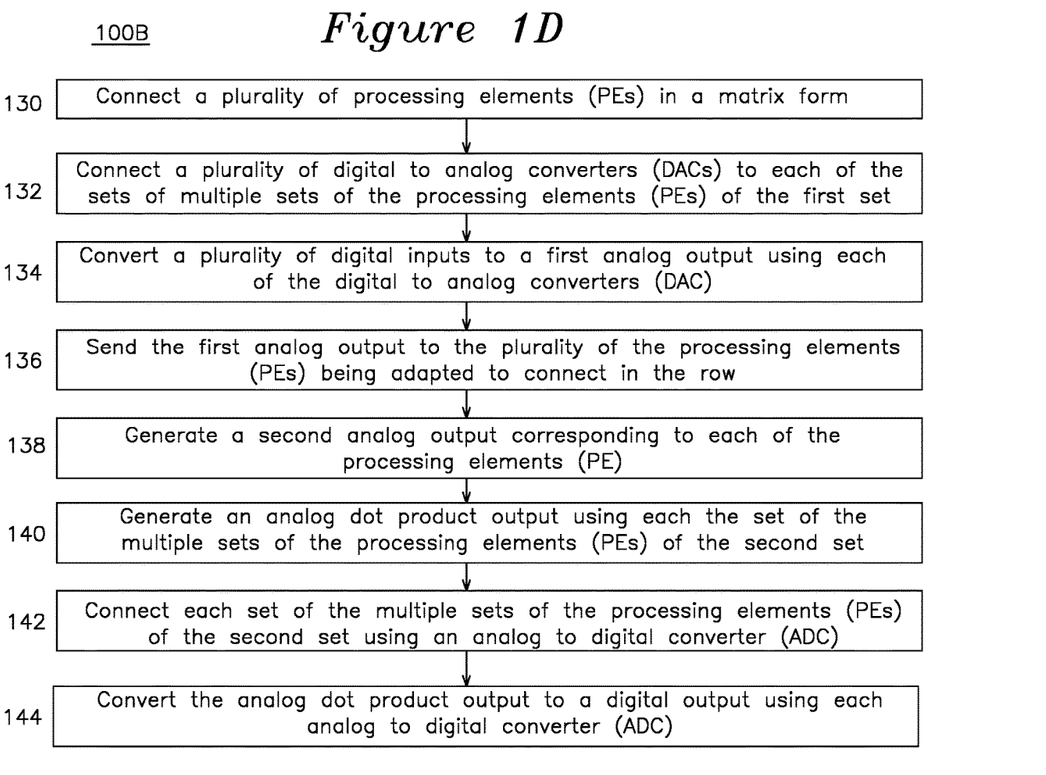
FIG. 1D illustrates a flow diagram of a method for saving power in a real time hardware processing unit, in accordance with an embodiment of the present invention.

FIG. 1D illustrates a flow diagram of a method for saving power in a real time hardware processing unit, in accordance with an embodiment of the present invention. At step 130, connect a plurality of processing elements (PEs) (108) in a matrix form. A first set of the processing elements (PEs) (108) comprises a multiple sets of the processing elements (PEs) (108); wherein each set of the multiple sets of the processing elements (PEs) (108) of the first set comprises a plurality of the processing elements (PEs) (108) being adapted to connect in a row. A second set of the processing elements (PEs) (108) comprises a multiple sets of the processing elements (PEs) (108); wherein each set of the multiple sets of the processing elements (PEs) (108) of the second set comprises a plurality of the processing elements (PEs) (108) being adapted to connect in a column.

At step 132, connect a plurality of digital to analog converters (DAC) (102) to each set of the multiple sets of the processing elements (PEs) (108) of the first set. At step 134, convert a plurality of digital inputs (110) to a first analog output (114) using each digital to analog converter (DAC) (102). At step 136, send the first analog output (114) to the plurality of the processing elements (PEs) (108), which are adapted to connect in the row, using each the digital to analog converters (DAC) (102) such that the first analog output of the digital to analog converters (DAC) (102) being an input to the plurality of the processing elements (PEs) (108), which are adapted to connect in the row.

At step 138, generate a second analog output (115) corresponding to each the processing element (PE) (108), wherein the second analog output of each the processing element (PE) (108) is a product of the first analog output of the digital to analog converter (DAC) and a digital weight input (112).

At step 140, generate an analog dot product output (116) using each set of the multiple sets of the processing elements (PEs) (108) of the second set. At step 142, connect each the set of the multiple sets of the processing elements (PEs) (108) of the second set using an analog to digital converter (ADC). At step 144, convert the analog dot product output (116) to a digital output (118) using each the analog to digital converter (ADC) (104).

Figure 1E:
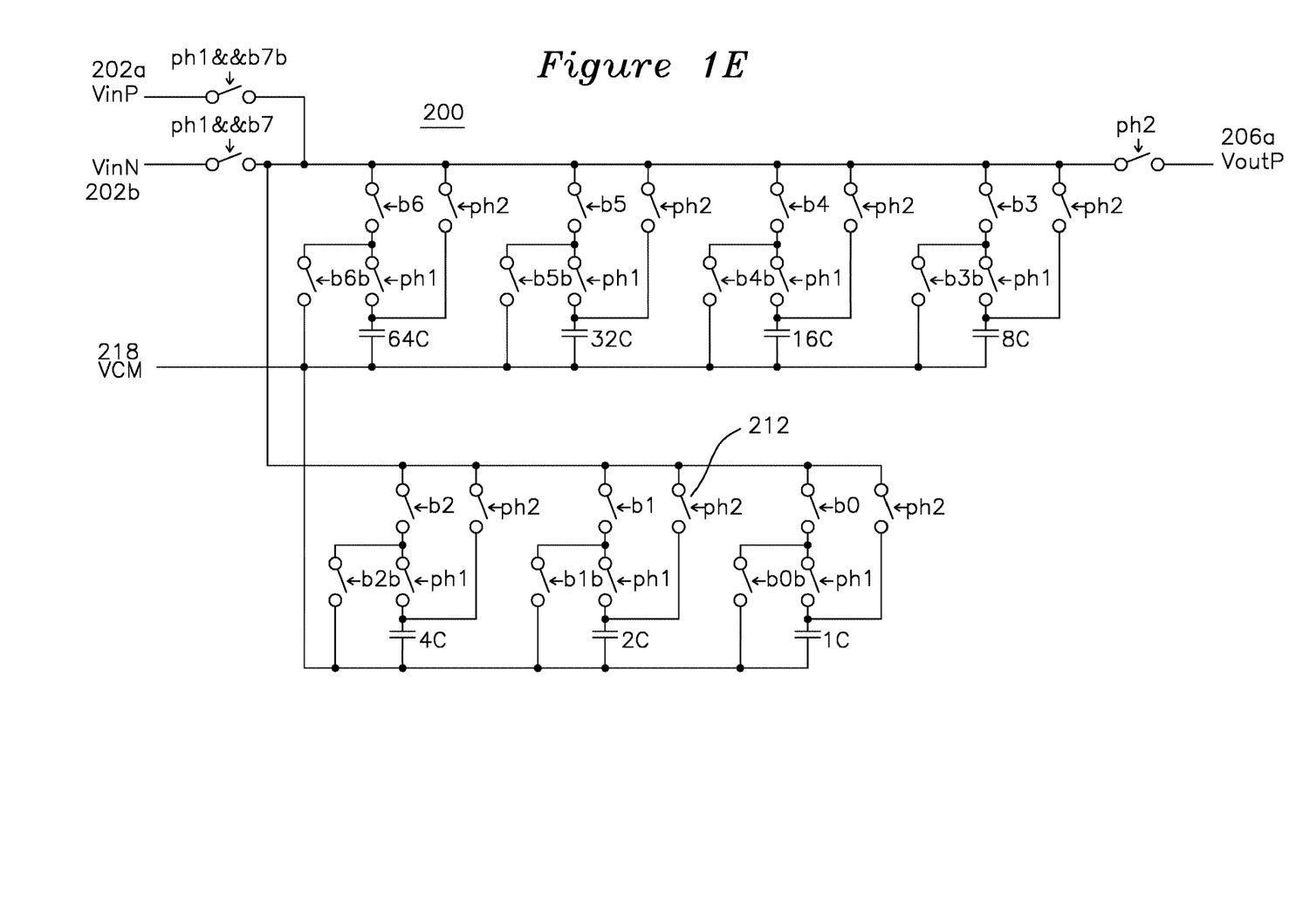
FIGS. 1E and 1F illustrates a schematic diagram of multiplier implementation using capacitors, in accordance with an embodiment of the present invention.
Figure 1F:
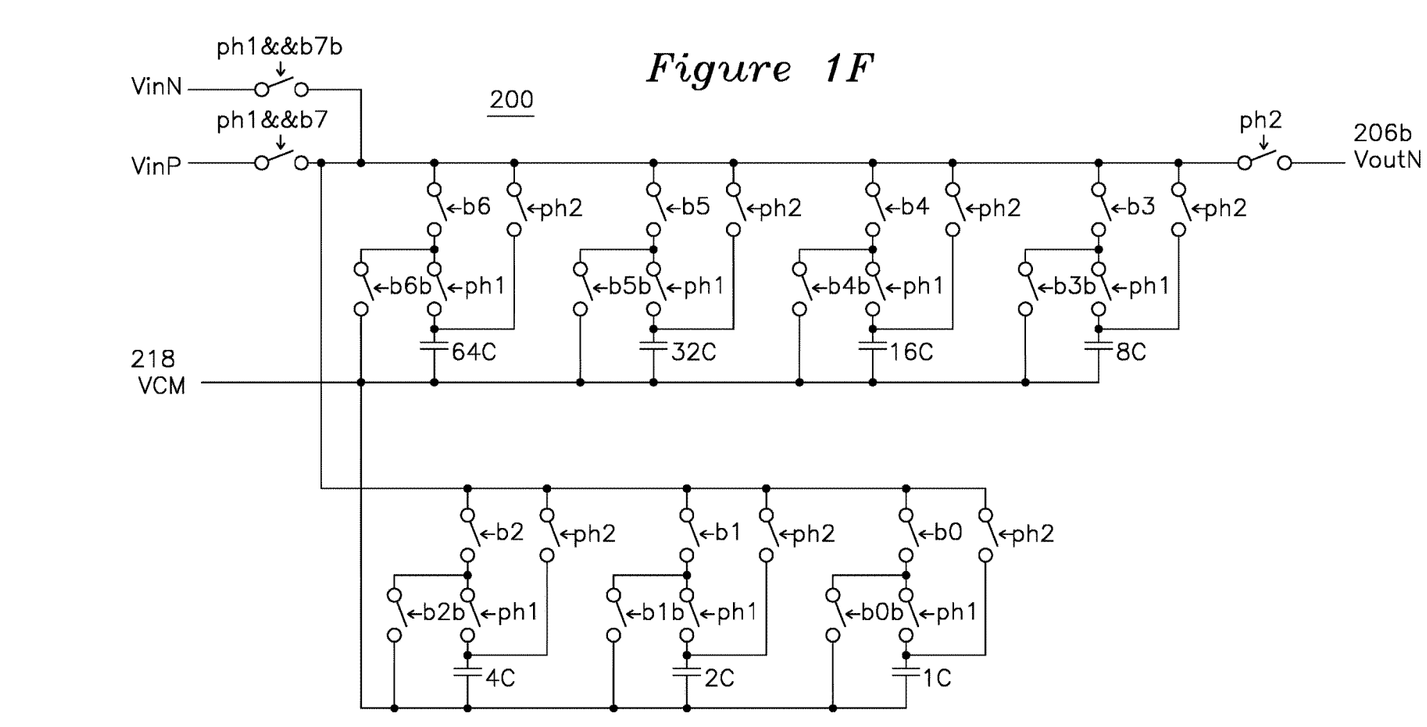
Figure 1G:
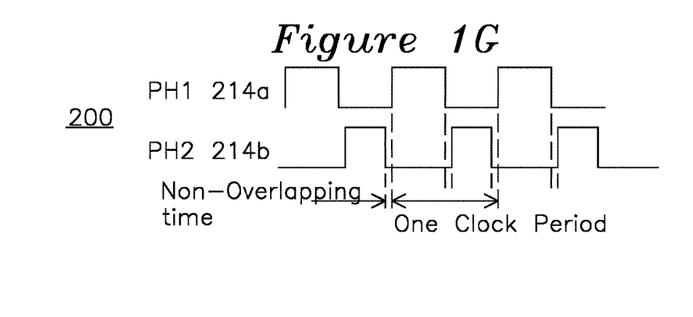
FIG. 1G is a waveform plot of ph1 and ph2.
Figure 1H:
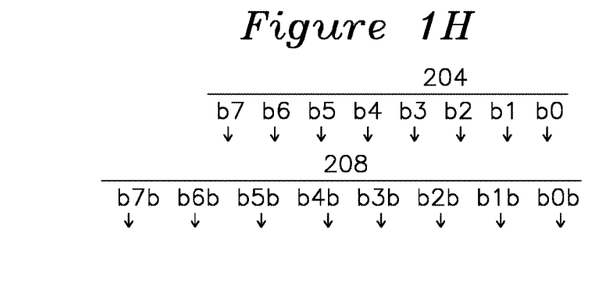
FIG. 1H is a diagram of the inputs [b7:b0] and complement inputs [b7b:b0b]

FIGS. 1E and 1F (200) illustrate a schematic diagram of multiplier implementation using capacitors (210), in accordance with an embodiment of the present invention. As shown in the figures, the circuit implementation of one multiplication operation between an analog input (202a/202b) and a digital input (204) is done by using capacitors (210) and switches (212). The circuit takes a fully differential analog input (Vinp (202a), or Vinn (202b)), a 8-bit digital input [b7: b0] (204) of FIG. 1H in sign-magnitude form where Most Significant Bit (MSB) represents sign, and a two phase non-overlapping clock signal (ph1 (214a), ph2 (214b)) of FIG. 1G). The 8-bit width for digital input is taken or mentioned here for explanation purpose only. However, the present invention is also applicable to n-bit width.

The circuit comprises a set of binary weighted capacitors (210) and multiple switches (212). The set of binary weighted capacitors, namely 1C, 2C, 4C, 8C, 16C, 32C and 64C, are connected with multiple switches (212), which are controlled by clock (214a/214b) and digital input (204), in a particular pattern. Here, "C" is the value of a unit capacitor. To realize differential implementation, this multiplier has two copies of same circuit wherein the difference between them are the analog input (202a or 202b) and analog output (206a or 206b). Hereafter, one half circuit is explained exclusively and, the other half circuit performs similarly with the complementary analog input and produces complementary analog output.

With respect to the sign bit of the digital input, one half of the differential analog input i.e. either Vinp (202a) or Vinn (202b), is sampled to the circuit during the "ON" period of the "ph1" clock (214a). If sign-bit is "0", "Vinp" (202a) is sampled to the circuit during the "ON" period of the "ph1" clock (214a). If sign-bit is "1" then "Vinn" (202b) is sampled to the circuit during the "ON" period of the "ph1" clock (214a).

The pattern of arranging the capacitors (210), switches (212) is shown in the FIGS. 1E and 1F, wherein each capacitor is connected to the analog input (202a/202b) through two switches (212), each switch is controlled by the "ph1" clock (214a) and the corresponding digital input (204) bit respectively. The digital input bit is one among "b6" to "b0" bits. In addition to that, each capacitor (210) is short circuited through two switches, (212), wherein each switch is controlled by the "ph1" clock (214a) and the complement of the corresponding digital input (208) bit. Hence, with the same clock ("ph1"), the analog input (204a/204b) is sampled into the capacitors (210) corresponding to the digital input (204) bits which are "1", and rest of the capacitors are reset. In other words, both sampling of analog input and reset operation are performed in the same clock cycle. For example, if the digital input bit "b5" is "1" and "ph1" is "ON", then "32C" is connected to "Vinp(202a)/Vinn(202b)". If "b5" is "0" and "ph1" is "ON" then "32C" is reset. Advantages of this arrangement/pattern are, (i) no additional clock phase is required to reset the capacitors, (ii) the existing charge on the capacitors are reused in the next operation so that the power requirement for driving the analog inputs (202a/202b) in each cycle is reduced.

Operation of the Circuit

During "ON" time of "ph1" clock (214a), the analog input (Vinp (202a) or Vinn (202b) which is decided by the sign bit (MSB)) is sampled into the capacitors (210) corresponding to the digital input (204) bits which are "1". For example, if digital input is "01011011$_{(2)}$," then the analog input "Vinp" is sampled into 64C, 16C, 8C, 2C and 1C capacitors through the switches (212) controlled by corresponding digital input (204) bits namely b6, b4, b3, b1, b0. Hence the total charge is Qin=Vinp*91C (91C=64C+16C+8C+2C+1C). At the same time the capacitors namely 32C and 4C are reset through the switches controlled by the complements of the corresponding digital input bits namely b5b and b2b. Hence the charge on the two capacitors is zero.

During the "ON" time of "ph2" clock (214b), all the capacitors are connected in parallel through the switches (212). Since all the capacitors are connected in parallel, the charge stored during the "ON" time of "ph1" clock (214a) is shared among all the capacitors. Hence generated voltage output (206a) during the "ON" time of "ph2" (214b) is corresponding to the product of analog and digital inputs.

For example, as stated in the previous example, if the stored charge is Qin=Vinp*91C, the generated output voltage is Voutp=Vinp*91C/127C=Vinp*91/127, wherein 127C is the total capacitance (64C+32C+16C+8C+4C+2C+1C).

At the same time, the other half circuit takes the analog input "Vinn" (202b) and computes the analog output "Voutn" (Voutn=Vinn*91/127) (206b) in a similar manner.

Figure 1I:
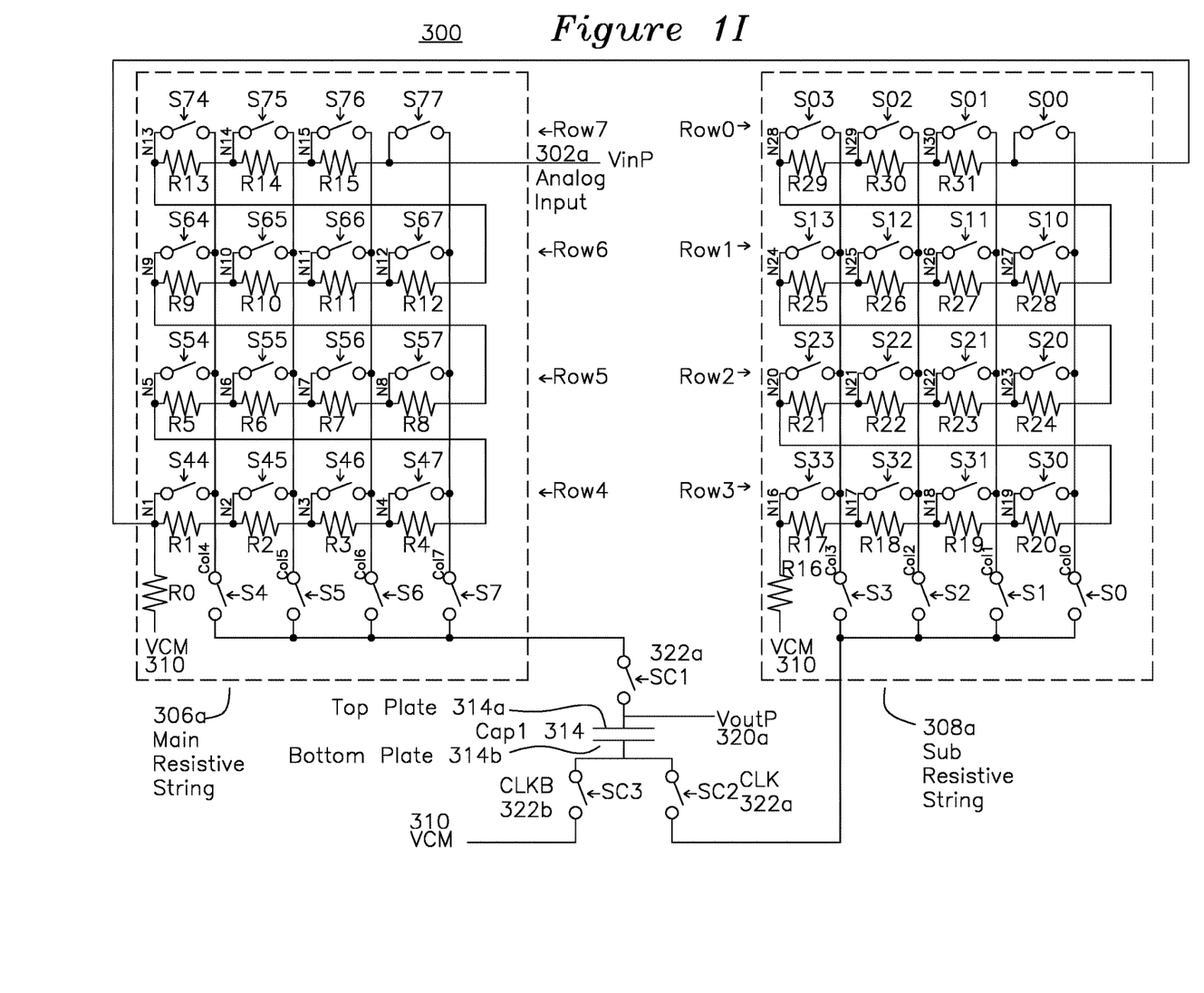
FIGS. 1I and 1J illustrate a schematic diagram of resistive string-based multiplier using resistors, in accordance with an embodiment of the present invention.
Figure 1J:
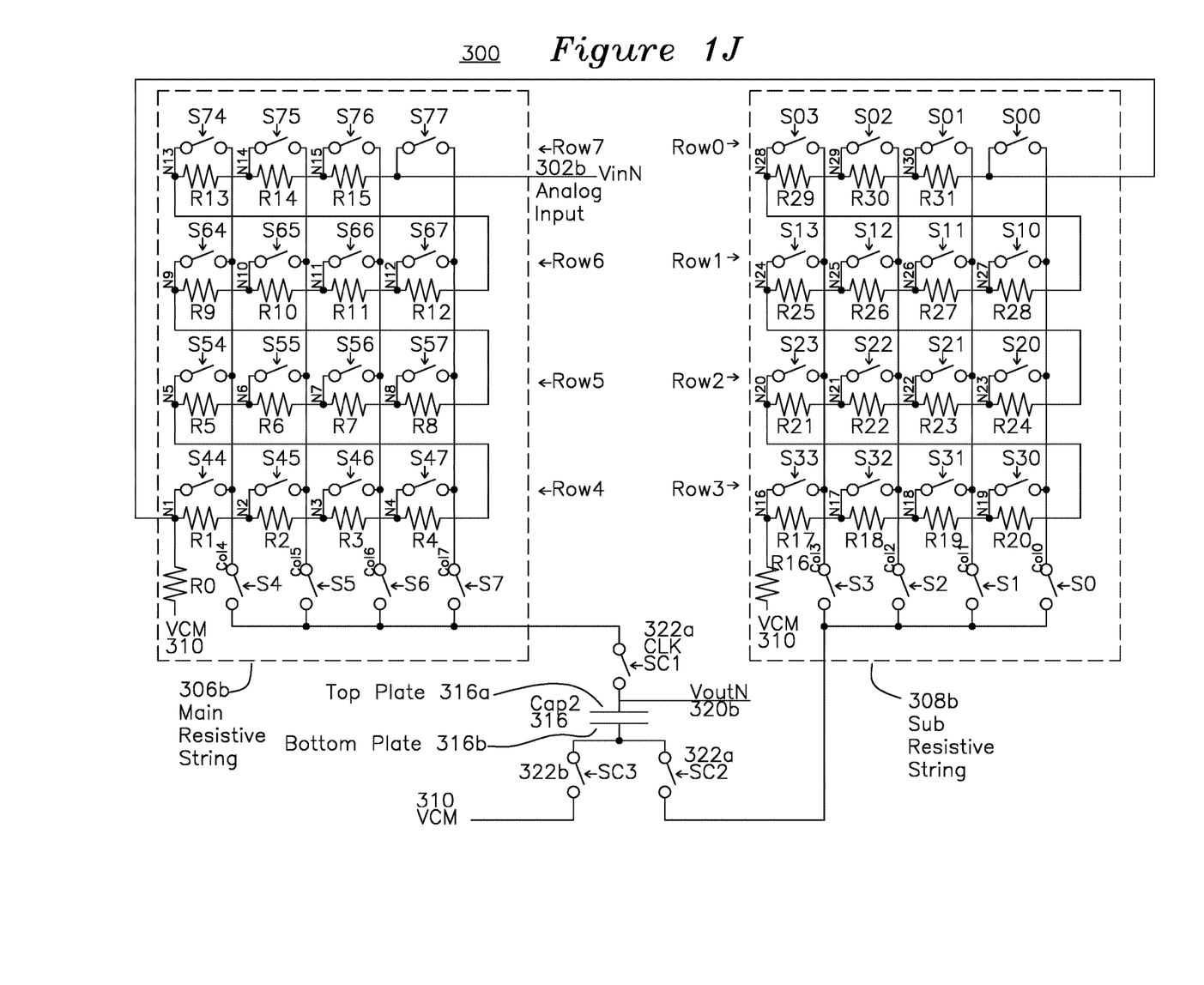

FIGS. 1I and 1J illustrate the schematic diagram of resistive string-based multiplier using resistors (300), in accordance with an embodiment of the present invention. As shown in the figures (300), the differential version of the 8-bit resistive string multiplier comprises of two main resistive strings (306a, 306b), two sub resistive strings (308a,308b), four decoders (312a,312b,312c,312d), switching mechanisms (S00 to S77) and two capacitors (314,316).

Each of the main resistive string 306a (or 306b) comprises of 16 resistors (R0 to R15) and divide the input voltage Vinp (or Vinn) into 16 distinct values from 0 to input voltage vinp (or vinn) (302a/302b) with step vinp/16 (or vinn/16). Each of the sub resistive string 308a (or 308b) comprises of 16 resistors (R16 to R31) and divide the vinp/16 (or Vinn/16) value of the main resistive string voltage 306a (or 306b) into again 16 distinct values with step vinp/256 (or vinn/256).

Figure 1K:
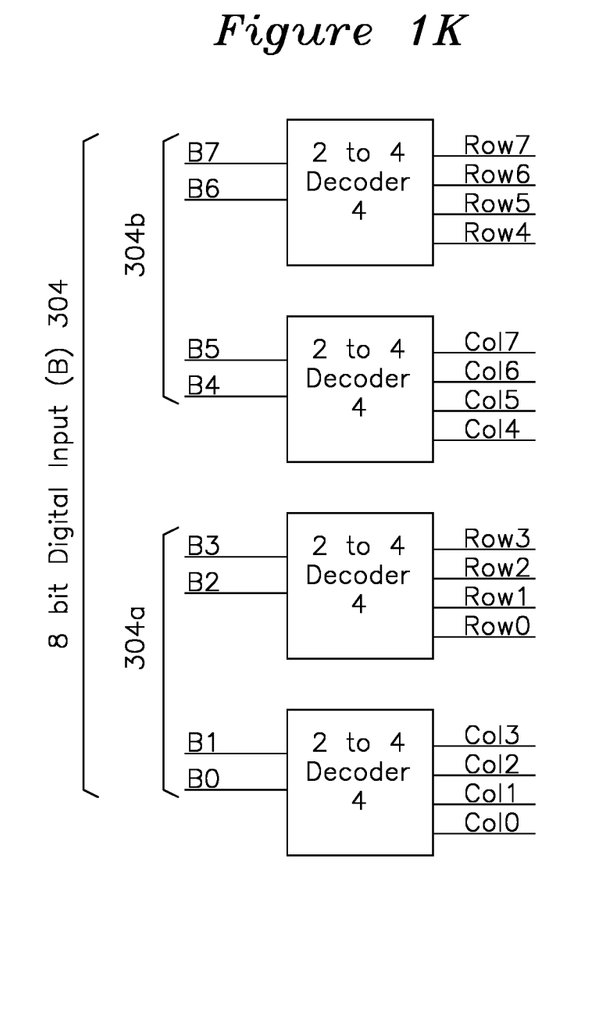
FIG. 1K shows decoders for use with FIGS. 1I and 1J.
Figure 1L:
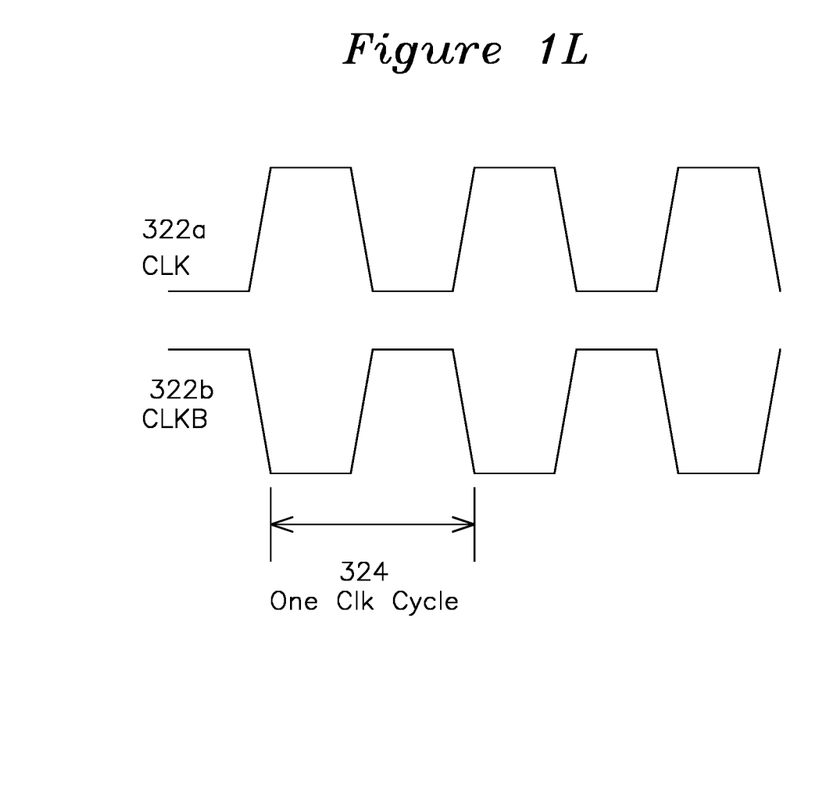
FIG. 1L shows a clock waveform plot.

FIG. 1K shows a block diagram of coefficient 8 bits (B) (304) sub divided into four most significant bits (4 MSBs) (304b) and four least significant bits (4 LSBs) (304a). Based on the 4 MSB (304b) values, during the "ON" period of the CLK (322a), one of the node voltage of the main resistive strings 306a (or 306b) is sampled on the top plate 314a (or 316a) of the capacitor 314 (or 316) through a first clock switch (SC1). Similarly, based on the 4 LSB values, during the "ON" period of the CLK (322a), one of the node voltage of sub resistive strings 308a (or 308b) is sampled on the bottom plate 314b (or 316b) of the capacitor 314 (or 316) through a second clock switch (SC2). The first clock switch (SC1) and the second clock switch (SC2) are closed during 'ON' period of the clock. The switches (S00-S03,S10-S13, S20-S23,S30-S33,col0,col1,col2 and col3; S44-S47,S54-S57,S64-S67,S74-S77,col4,col5,col6 and col7;) and decoders (312a,312b; 312c,312d) for their control are arranged, to maintain the voltage across the capacitor, proportional to the product of input voltage (vinp or vinn) (302a,302b) and the digital coefficient (B) (304). The third clock switch (SC3) is closed and the bottom plate of the first capacitor is connected to the common mode voltage during "off" period of the clock such that the analog voltage output is available at the top plate of the capacitor, which is proportional to the product of input voltage (vinp or vinn) (302a,302b) and the digital coefficient (B) (304). The 8-bit width for digital input is taken or mentioned here for explanation purpose only. However, the present invention is also applicable to n-bit width.

During the "ON" period of the CLK, the bottom plate 314b (or 316b) of the capacitor 314 (or 316) gets connected to common mode voltage (VCM) (310) and also the top plate 314a (or 316a) voltage is available as an output voltage.

Hence, the output voltage 320a (or 320b) of the Multiplier is proportional to the product of input voltage Vinp (or Vinn) and the digital coefficient (B) (304). For example, if vinp=400 mV, Vinn=0V, Vcm=200 mV and B=10101001$_{(2)}$ then during the positive half cycle of CLK/the "ON" period of the "ph1" CLK, 24 the capacitor C1 top plate gets a voltage equal to 1011$_{(2)}$*(vinp−Vcm)/16 (i.e., 11*(Vinp−Vcm)/16 and the bottom plate capacitor gets the voltage equal to (1111$_{(2)}$−1001$_{(20)}$−1)*(Vinp−Vcm)/256 (i.e., 5*(vinp−vcm)/256). Finally, the difference between the two plates voltage is equal to 10101001$_{(2)}$*(Vinp−Vcm)/256. The differential output, Vout is equal to vin*B/256. The operation of the circuit explained hereinabove with respect to the positive side input and output signals Vinp and Voutp. The present system multiplies the vinp and Vinn analog input signals with the digital coefficient (B) and produces analog outputs Voutp and Voutn respectively.

Advantages

1. One multiplication and addition operation is performed within one clock period. Hence the circuit is faster for a specific power.
2. No pipelined operation is performed in the circuit and hence no latency at the output.
3. Each DAC and ADC are shared by multiple PE cells.
4. Number of DACs and ADCs used in the present invention are equal to number of rows ("m") and columns ("n") in the PE matrix respectively.
5. The present invention is scalable to different operating clock speeds, different input and output sizes.
6. In the capacitor-based multiplier, the input sampling and reset of capacitors are performed in the same clock cycle.
7. No extra cycle is required to reset the capacitors.
8. The charge stored on the capacitors is partially reused in the next multiplication cycle, so that the energy required to charge the capacitors in the next computation cycle is reduced. Hence additional power saving is achieved.
9. The resistor-based multiplier generates fully monotonic output.

Having described and illustrated the principles of the invention with reference to described embodiments, it will be recognized that the described embodiments may be modified in arrangement and detail without departing from such principles.

In view of the many possible embodiments to which the principles of the invention may be applied, we claim the invention as all such embodiments may come within the scope and spirit of the claims and equivalents thereto.

While the present invention has been related in terms of the foregoing embodiments, those skilled in the art will recognize that the invention is not limited to the embodiments depicted. The present invention may be practiced with modification and alteration within the spirit and scope of the appended claims. Thus, the description is to be regarded as illustrative instead of restrictive on the present invention.

The detailed description is presented to enable a person of ordinary skill in the art to make and use the invention and is provided in the context of the requirement for obtaining a patent. The present description is the best presently-contemplated method for carrying out the present invention. Various modifications to the preferred embodiment will be readily apparent to those skilled in the art and the generic principles of the present invention may be applied to other embodiments, and some features of the present invention may be used without the corresponding use of other features. Accordingly, the present invention is not intended to be limited to the embodiment shown but is to be accorded the widest scope consistent with the principles and features described herein.

We claim:
1. A system for saving power in a real time hardware processing unit, said system comprising:
a first circuit and a second circuit;
wherein the first circuit is substantially identical to the second circuit;
wherein the first circuit comprising:
a plurality of binary weighted capacitors;
a plurality of switches;
wherein the plurality of switches are adapted to connect the corresponding plurality of binary weighted capacitors;
a two phase non-overlapping clock signal input defined a phase one non-overlapping clock signal input, a phase two non-overlapping clock signal input;
an analog input defined a first analog input (Vinp), a second analog input (Vinn);
a plurality of digital input bits;
wherein each the digital input bit is adapted to connect the corresponding switch such that each the digital input bit is adapted to control the corresponding switch;
wherein a most significant bit of the plurality of digital input bits determines a first analog input (Vinp) if the most significant bit is zero;
wherein the most significant bit of the plurality of digital input bits determines a second analog input (Vinn) if the most significant bit is one;
the plurality of binary weighted capacitors adapted to connect the first analog input during the phase one non-overlapping clock signal input if the most significant bit of the plurality of digital inputs is zero and the plurality of digital inputs of the corresponding plurality of binary weighted capacitors are ones;
the plurality of binary weighted capacitors adapted to reset during the phase one non-overlapping clock signal input if the plurality of digital inputs of the corresponding plurality of binary weighted capacitors are zero;
or the plurality of binary weighted capacitors adapted to connect the second analog input during the phase one non-overlapping clock signal input if the most significant bit of the plurality of digital inputs is one and the plurality of digital inputs of the corresponding plurality of binary weighted capacitors are ones;
and the plurality of binary weighted capacitors adapted to reset during the phase one non-overlapping clock signal input if the plurality of digital inputs of the corresponding plurality of binary weighted capacitors are zeros;
and the plurality of capacitors adapted to connect in parallel during the phase two non-overlapping clock signal input such that the plurality of capacitors generate a first analog output(206a);
wherein the second circuit comprising:
a plurality of binary weighted capacitors;
a plurality of switches;
wherein the plurality of switches are adapted to connect the corresponding plurality of binary weighted capacitors;
a two phase non-overlapping clock signal input defined as a phase one non-overlapping clock signal input, a phase two non-overlapping clock signal input;
a differential analog input defined as a first analog input (Vinp), a second analog input (Vinn);
a plurality of digital input bits;
wherein each the digital input bit is adapted to connect the corresponding switch such that each the digital input bit is adapted to control the corresponding switch;
wherein a most significant bit of the plurality of digital input bits determines a second analog input (Vinn) if the most significant bit is zero;
wherein the most significant bit of the plurality of digital input bits determines a first analog input (Vinp) if the most significant bit is one;
the plurality of binary weighted capacitors adapted to connect the first analog input during the phase one non-overlapping clock signal input if the most significant bit of the plurality of digital inputs is one and the plurality of digital inputs of the corresponding plurality of binary weighted capacitors are ones;

and the plurality of binary weighted capacitors adapted to reset during the phase one non-overlapping clock signal input if the plurality of digital inputs of the corresponding plurality of binary weighted capacitors are zero; or the plurality of binary weighted capacitors adapted to connect the second analog input during the phase one non-overlapping clock signal input if the most significant bit of the plurality of digital inputs is zero and the plurality of digital inputs of the corresponding plurality of binary weighted capacitors are ones;

and the plurality of binary weighted capacitors adapted to reset during the phase one non-overlapping clock signal input if the plurality of digital inputs of the corresponding plurality of binary weighted capacitors are zeros; and the plurality of capacitors adapted to connect in parallel during the phase two non-overlapping clock signal input such that the plurality of capacitors generate a second analog output.

2. The system of claim 1, wherein the analog input is a fully differential analog input.

3. The system of claim 1, wherein the digital input is an eight bit digital input in sign magnitude form.

4. The system of claim 1 further comprising a common mode voltage (VCM), wherein the common mode voltage is adapted to connect one of a terminals of the plurality of capacitors.

5. The system of claim 1, wherein the most significant bit of the plurality of digital input bits is a sign bit.

* * * * *